(12) United States Patent
Lai

(10) Patent No.: US 6,375,287 B1
(45) Date of Patent: Apr. 23, 2002

(54) RETAINING DEVICE FOR A SIDE COVER OF A COMPUTER CASING

(76) Inventor: Vincent Lai, No. 57 Lane 350, Nanshang Road, Gueishan Hsiang, Taoyuan Hsien (TW)

( * ) Notice: Subject to any disclaimer, the term of this patent is extended or adjusted under 35 U.S.C. 154(b) by 0 days.

(21) Appl. No.: 09/618,387

(22) Filed: Jul. 18, 2000

(51) Int. Cl.[7] .............................................. A47B 97/00
(52) U.S. Cl. .................... 312/223.2; 312/218; 312/222; 292/302
(58) Field of Search ............................ 312/223.2, 223.1, 312/263, 265.5, 217, 218, 222; 292/19, 341.15, 300, 302, 303; 361/683, 724, 725, 726

(56) References Cited

U.S. PATENT DOCUMENTS

| | | | | |
|---|---|---|---|---|
| 3,186,197 A | * | 6/1965 | Gehrie ................... 292/302 X |
| 4,740,020 A | * | 4/1988 | Williams ................ 292/302 X |
| 5,116,261 A | * | 5/1992 | Lan et al. ............... 361/685 X |
| 5,825,626 A | * | 10/1998 | Hulick et al. ......... 312/223.2 X |
| 5,967,633 A | * | 10/1999 | Jung ....................... 312/223.2 |
| 5,992,955 A | * | 11/1999 | Yang ....................... 312/263 X |
| 5,997,115 A | * | 12/1999 | Radloff et al. ........ 312/223.2 X |
| 6,015,195 A | * | 1/2000 | Anderson et al. ......... 312/223.2 |
| 6,053,586 A | * | 4/2000 | Cook et al. .............. 312/223.2 |
| 6,099,050 A | * | 8/2000 | Daoud ............... 292/341.15 X |
| 6,109,710 A | * | 8/2000 | Wu et al. ................. 312/223.2 |

\* cited by examiner

*Primary Examiner*—Peter M. Cuomo
*Assistant Examiner*—Hanh V. Tran
(74) *Attorney, Agent, or Firm*—Pro-Techtor International Services

(57) ABSTRACT

A retaining device for a side cover of a computer casing has a sliding plate movably received beneath the top face of the computer casing and a set of extensions formed on the side cover. The sliding plate has a wedged block formed to detachably engage with distal ends of the extensions. The movement of the sliding plate allows the wedged block to engage with the distal ends of the extensions of the side cover to push away the side cover from the computer casing. Therefore, the side cover is separated from the computer casing readily.

3 Claims, 4 Drawing Sheets

RETAINING DEVICE FOR A SIDE COVER OF A COMPUTER CASING

BACKGROUND OF THE INVENTION

1. Field of the Invention

The present invention relates to a retaining device of a computer casing, and more particularly to a retaining device for a side cover of a computer casing. The retaining device has a sliding plate movably secured beneath the top face of the computer casing and a set of extensions respectively mounted on the side cover. The sliding plate has a wedged block formed thereon and detachably engaged with distal ends of the extensions. With such an arrangement, the user is able to detach the side cover from the computer casing easily.

2. Prior Art Description

A conventional side cover of a computer casing normally is screwed onto the casing. When necessary, the user will have to use a screw driver to unscrew the side cover from the casing, which is time consuming and labor inefficient. To overcome the drawback, a snapping hook is provided to the side cover, which is corresponding to the hole defined in the casing, such that when necessary, the user can detach the side cover from the casing easily by separating the engagement between the snapping hook and the hole. However, separating the engagement between the snapping hook of the side cover and the hole of the casing often causes damage to the snapping hook and even break to the snapping hook, which bothers the user a lot.

To overcome the shortcomings of the above mentioned problems, the present invention provides an improved retaining device mounted respectively on a top face of the casing and the side cover, such that the user is able to detach the engagement between the side cover and the casing easily.

SUMMARY OF THE INVENTION

The primary objective of the invention is to provide an improved retaining device having a sliding plate movably received beneath the top face of the computer casing and a set of extensions formed on the side cover. The sliding plate has a wedged block formed to detachably engage with distal ends of the extensions. The user pulls out of the sliding plate from beneath the front face of the computer casing, the wedged blocks engage with the distal ends of the extensions of the side cover to push away the side cover from the computer casing. Therefore, the user is able to detach the side cover from the computer casing readily.

Other objects, advantages and novel features of the invention will become more apparent from the following detailed description when taken in conjunction with the accompanying drawings.

DETAILED DESCRIPTION TO THE PREFERRED EMBODIMENT

Figure 1:
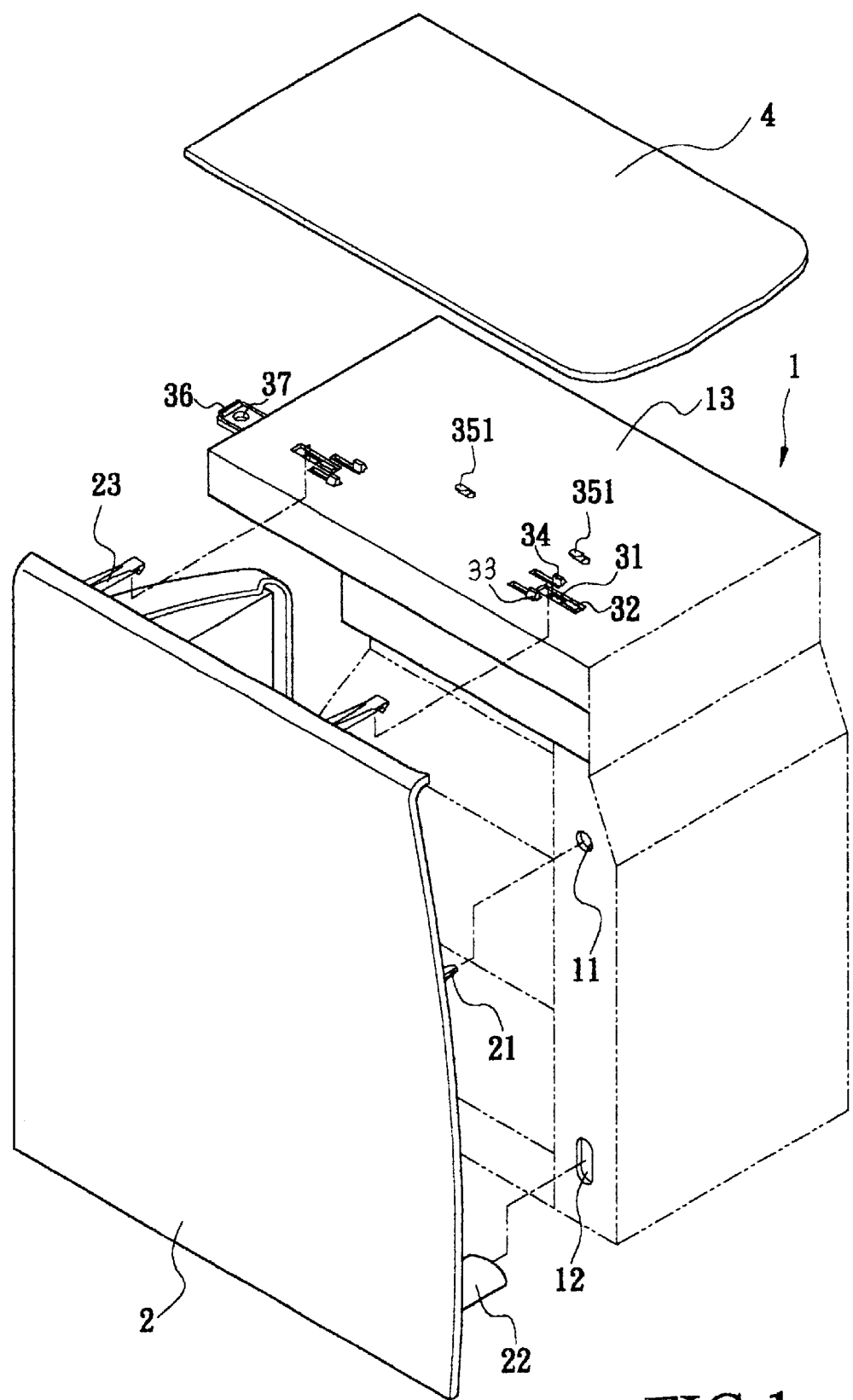
FIG. 1 is a perspective view of the retaining device respectively mounted beneath the front face and the side cover of a computer casing.

With reference to FIGS. 1, a computer casing (1) has a side cover (2) detachably connected to the computer casing (1) by means of a retaining device constructed in accordance with the present invention. The computer casing (1) has a first positioning hole (11) and a second positioning hole (12) respectively defined in a side face thereof. The side cover (2) has a first rod (21) extending out to correspond to the first positioning hole (11) and a second rod (22) extending out to correspond to the second positioning hole (12). With the insertion of the first and the second rods (21,22) into the corresponding first and second positioning holes (11,12), the side cover (2) is able to be temporarily positioned.

Figure 2:
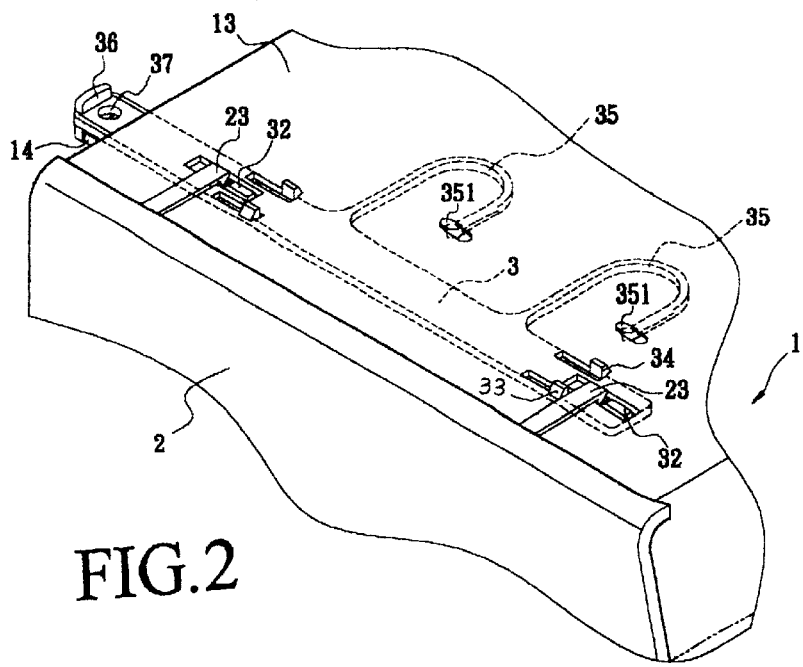
FIG. 2 is an exploded perspective view of the retaining device constructed in accordance with the present invention.
Figure 3:
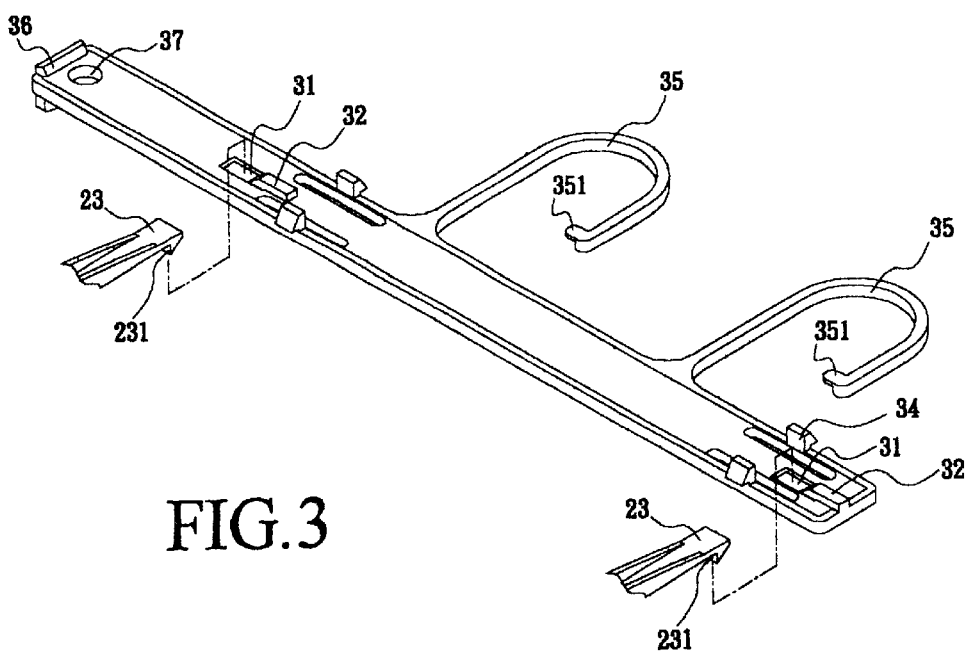
FIG. 3 is a schematic view showing the engagement of the side cover and the computer casing by means of the retaining device of the invention.

With reference to FIGS. 2 and 3 and still taking FIG. 1 for reference, the retaining device has a sliding plate (3) movably secured beneath a top face (13) of the casing (1) and having a set of extensions (23) securely mounted to the side cover (2). The sliding plate (3) has a cutout (31) defined in a distal end thereof, a wedged block (32) formed on an end of the cutout (31), two positioning blocks (33,34) formed on opposed sides of the cutout (31), at least an arcuate extension (35) extending out from a side thereof and having a boss (351) formed on a distal end of the arcuate extension (35), a wall (36) formed on the other distal end of the sliding plate (3) and a through hole (37) defined near the wall (36).

Each of the distal ends of the extensions (23) has a hook (231) formed thereon to detachably engage with the wedged block (32).

Referring to FIG. 1, it is to be noted that multiple holes (not numbered) are defined in the top face of the computer casing (1) and each respectively corresponding to the boss (351) of the arcuate extension (35) and the positioning blocks (33,34). Therefore, the sliding plate (3) is able to be securely attached beneath the top face of the computer casing (1).

Figure 4:
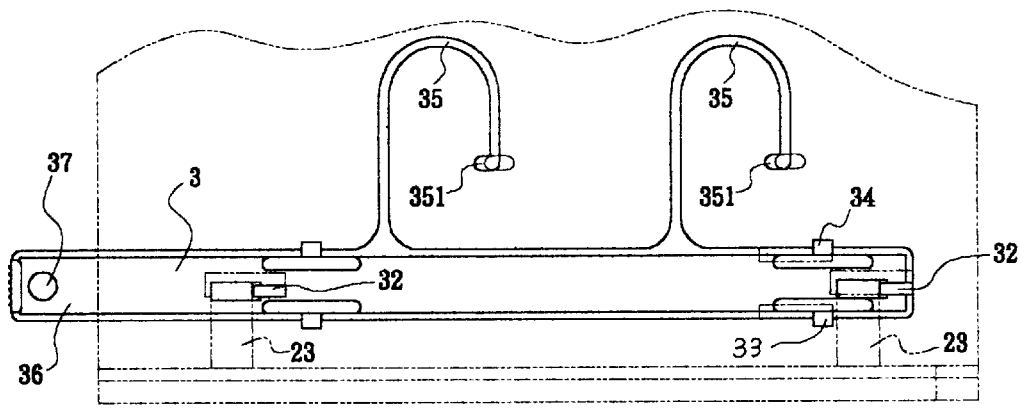
FIG. 4 is a top view showing schematically the engagement between the sliding plate and the extensions.
Figure 5:
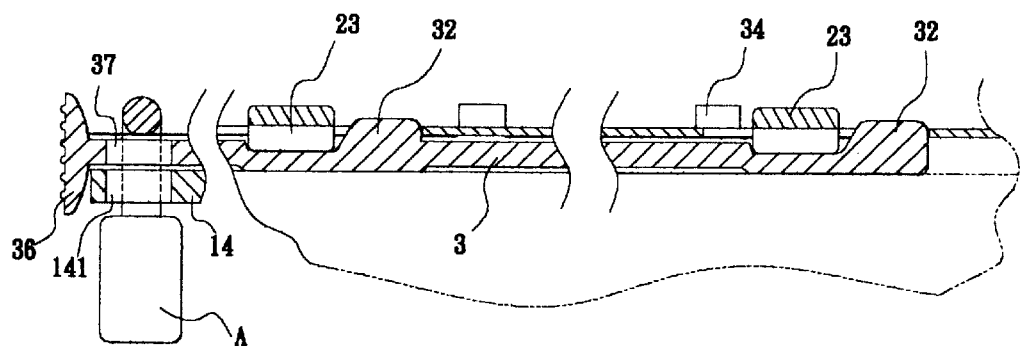
FIG. 5 is a schematic side view showing the engagement between the sliding plate and the extensions.
Figure 6:
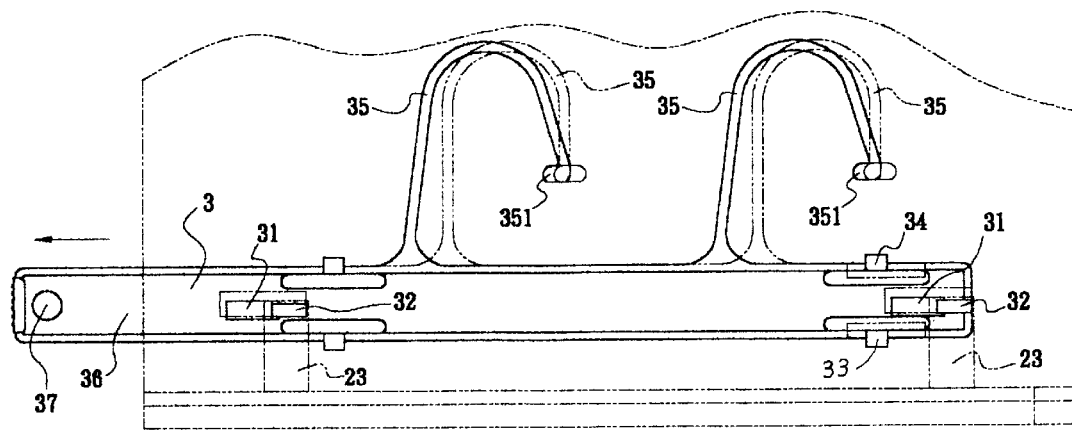
FIG. 6 is a top view showing schematically the disengagement between the sliding plate and the extensions.
Figure 7:
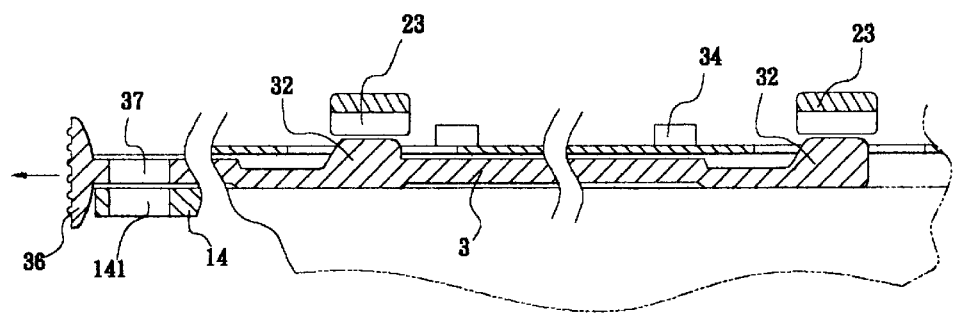
FIG. 7 is a schematic side view showing the disengagement between the sliding plate and the extensions.

With reference to FIG. 2, FIG. 4 and FIG. 5, when the side cover (2) is to be mounted on the computer casing (1), the user inserts the hooks (231) of the extensions (23) into a corresponding one of the cutouts (31) in the sliding plate (3). It is seen from the drawing that two cutouts (31) are defined in the sliding plate (3) and two sets of wedges blocks (32), two sets of positioning blocks (33,34) are respectively formed on the sliding plate (3). For simplicity, only one set of the relative relationship between the extensions (23) and the sliding plate (3) is introduced.

After the hook (231) is inserted into the corresponding cutout (31) and the first and second rods (21,22) are inserted into the corresponding first and second positioning holes (11,12), the side cover (2) is secured to the computer casing (1). To enhance the attachment between the side cover (2) and the computer casing (1), a plate (14) with an opening (141) corresponding to the through hole (37) is provided to the sliding plate (3). A lock (A) is provided to be inserted through the aligned through hole (37) and the opening (141) to further strengthen the engagement between the side cover (2) and the computer casing (1).

When the disengagement between the side cover (2) and the computer casing (1) is necessary, the user pulls the wall (36) to allow the wedged block (32) to engage with the hook (231) of the extension (23) and eventually push the extension (23) away from the computer casing (1).

From the above description, it is noted that the retaining device enables the user to detach the side cover (2) easily from the computer casing (1), which saves a lot of time and effort when compared with the conventional manner.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A retaining device for a side cover of a computer casing, said retaining device comprising:

a sliding plate movably secured beneath a top face and having a cutout defined in a distal end thereof, a block formed on an end of said cutout, two positioning blocks formed on opposed sides of said cutout, at least an arcuate extension extending out from a side thereof and having a boss formed on a distal end of said arcuate extension and securely attached to a bottom side of said top face of said computer casing, a wall formed on a distal end opposed to that of said cutout and a through hole defined near said wall; and at least one extension formed on a side face of said side cover and having a hook formed on a distal end of said extension to correspond to said cutout of said sliding plate;

whereby movement of said sliding plate will allow engagement between said block and said hook and thus push said side cover away from said computer casing.

2. The retaining device as claimed in claim 1, wherein: said block is wedged.

3. The retaining device as claimed in claim 2, wherein: said through hole corresponds to an opening defined in a plate of said computer casing, such that a lock secures engagement between said computer casing and said side cover by inserting through said through hole aligned with said opening.

* * * * *